United States Patent [19]
Dent

[11] Patent Number: 5,745,856
[45] Date of Patent: Apr. 28, 1998

[54] RADIO RECEIVER FOR DEMODULATING BOTH WIDEBAND AND NARROWBAND MODULATED SIGNALS

[75] Inventor: Paul W. Dent, Stehag, Sweden

[73] Assignee: Telefoanktiebolaget LM Ericsson, Stockholm, Sweden

[21] Appl. No.: 807,773

[22] Filed: Feb. 28, 1997

Related U.S. Application Data

[63] Continuation of Ser. No. 135,542, Oct. 14, 1993, abandoned.

[51] Int. Cl.⁶ .............................. H04B 1/38; H04M 1/00
[52] U.S. Cl. ................... 455/552; 455/266; 455/340
[58] Field of Search ............................ 455/339–340, 455/205, 210–211, 214, 254, 296, 307, 338, 266, 63, 76, 316, 346, 350, 550, 552, 553; 329/318, 320, 325; 375/346, 350, 348, 232

[56] References Cited

U.S. PATENT DOCUMENTS

| | | | |
|---|---|---|---|
| 4,045,740 | 8/1977 | Baker . | |
| 4,124,817 | 11/1978 | Takahashi . | |
| 4,262,361 | 4/1981 | Hauer . | |
| 4,267,605 | 5/1981 | Matsuzawa et al. . | |
| 4,352,208 | 9/1982 | Schroeder . | |
| 4,356,567 | 10/1982 | Eguchi et al. | 455/266 |
| 4,406,019 | 9/1983 | Ide et al. | 455/339 |
| 4,458,207 | 7/1984 | Favreau et al. . | |
| 4,479,091 | 10/1984 | Yoshisato . | |
| 4,479,257 | 10/1984 | Akiyama . | |
| 4,563,651 | 1/1986 | Ohta et al. . | |
| 4,598,426 | 7/1986 | Shiojima | 455/266 |
| 4,761,829 | 8/1988 | Lynk, Jr. et al. | 455/307 |
| 4,792,993 | 12/1988 | Ma . | |
| 4,816,770 | 3/1989 | Naumann . | |
| 4,885,553 | 12/1989 | Hietala et al. . | |
| 4,972,455 | 11/1990 | Phillips et al. | 455/76 |
| 4,984,247 | 1/1991 | Kaufmann et al. . | |
| 4,989,264 | 1/1991 | Ohto . | |
| 5,012,490 | 4/1991 | Myer | 455/340 |
| 5,048,059 | 9/1991 | Dent . | |
| 5,058,204 | 10/1991 | Tahernia et al. . | |
| 5,068,625 | 11/1991 | Baker et al. . | |
| 5,084,669 | 1/1992 | Dent . | |
| 5,095,534 | 3/1992 | Hiyama | 455/340 |
| 5,097,221 | 3/1992 | Miller . | |
| 5,105,164 | 4/1992 | Fisher et al. . | |
| 5,109,528 | 4/1992 | Uddenfeldt . | |
| 5,136,645 | 8/1992 | Brockman . | |
| 5,148,373 | 9/1992 | Dent . | |
| 5,159,709 | 10/1992 | Hansen | 455/340 |
| 5,191,598 | 3/1993 | Bäckström et al. . | |
| 5,241,702 | 8/1993 | Dent . | |
| 5,274,512 | 12/1993 | Tanaka et al. | 375/232 |
| 5,287,556 | 2/1994 | Cahill | 455/340 |
| 5,303,413 | 4/1994 | Braegas | 455/340 |
| 5,339,455 | 8/1994 | Vogt et al. | 455/266 |

OTHER PUBLICATIONS

H. Taub et al., "Principles of Communication Systems," Chapter 4, McGraw–Hill Book Co., New York (1971).

*Primary Examiner*—Nguyen Vo
*Attorney, Agent, or Firm*—Burns, Doane, Swecker & Mathis, L.L.P.

[57] ABSTRACT

A radio receiver is disclosed for demodulating both wideband and narrowband frequency-modulated signals. The radio receiver improves the capacity of a system by reducing the bandwidth occupancy of analog frequency modulation systems. The radio receiver comprises a superheterodyne frequency device which converts the received frequency-modulated signal to a fixed intermediate frequency signal. A filter then filters the intermediate frequency signal with a first filter bandwidth adapted to a wideband frequency-modulated signal. The filtered wideband frequency-modulated signal is demodulated in a demodulator using a frequency discriminator. The intermediate frequency signal is then filtered using a second and third filter bandwidth adapted to a narrowband frequency-modulated signal. Finally, the further-filtered intermediate frequency signal is demodulated using a frequency discriminator.

38 Claims, 3 Drawing Sheets

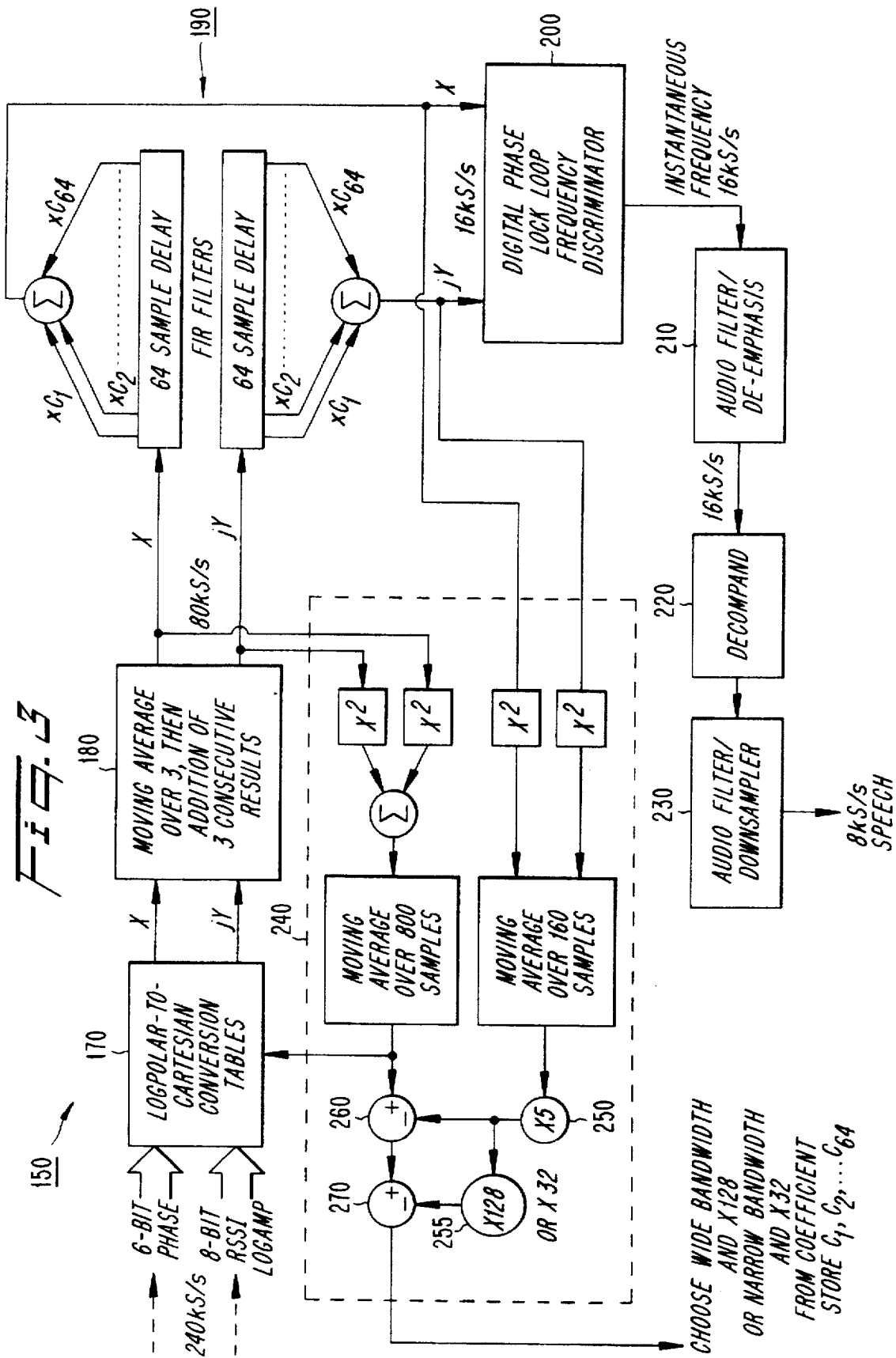

RADIO RECEIVER FOR DEMODULATING BOTH WIDEBAND AND NARROWBAND MODULATED SIGNALS

This application is a continuation of application Ser. No. 08/135,542, filed Oct. 14, 1993, now abandoned.

FIELD OF THE INVENTION

The present invention relates to adaptive analog frequency modulation (FM) for transmitting speech in radiotelephone communication systems, and more particularly to analog FM cellular receivers having bandwidths adapted so as to optimize average demodulated voice quality.

BACKGROUND OF THE INVENTION

At the present time, cellular mobile telephone systems use analog frequency modulation to transmit speech. The three principal cellular mobile communication system standards are the AMPS system used in the United States which uses wideband frequency modulation with a spacing between channels of 30 KHz, the TACS system used in the United Kingdom which uses 25 KHz channel spacings, and the NMT system used in Scandinavia which uses narrowband frequency modulation with 12.5 KHz channel spacings.

In an effort to alleviate the capacity restrictions of the current analog frequency modulation systems, digital transmission has been standardized for future systems in Europe, the U.S.A., and Japan. Nevertheless, digital transmission standards are complicated and not suitable for use everywhere. As a result, it is an object of the present invention to implement capacity improvements by reducing the bandwidth occupancy of analog frequency modulation systems.

Another approach to increasing system capacity by reducing bandwidth requirements is disclosed in a narrowband FM system according to the NAMPS specification. In the NAMPS system, a channel spacing of 10 KHz is achieved by splitting each 30-KHz channel of AMPS system into three sections. To accommodate the signal within the reduced bandwidth, both the frequency deviation, or modulation index, of the transmitted signal and the receiver's bandwidth are reduced.

Various aspects of frequency modulation communication systems are set forth in the prior art, including H. Taub et al., *Principles of Communication Systems*, chapt. 4, McGraw-Hill Book Co., New York (1971). For a sinusoidal modulating signal, the bandwidth B required to transmit or receive an FM signal with at least 98% power transmission is given by the following expression of Carson's rule:

$$B=2(\Delta f+f_m)$$

where $\Delta f$ is the maximum frequency deviation of the instantaneous frequency of the FM signal from the carrier frequency and $f_m$ is the frequency of the sinusoidal modulating frequency. The modulation index $\beta$ is related to $\Delta f$ and $f_m$ by the following expression:

$$\beta=\Delta f/f_m$$

When the modulation index is dominant, i.e., when $\Delta f \gg f_m$, the bandwidth according to Carson's rule is reduced proportional to the frequency deviation $\Delta f$. Thus, reducing the frequency deviation results in a commensurate reduction in the bandwidth.

For narrowband FM systems in which the modulation index is small, i.e., when $\Delta f \leq f_m$, reductions in the frequency deviation $\Delta f$ do not result in commensurate reductions in the bandwidth B. Thus, the level of the desired modulating signal transported by the modulation system decreases faster than the noise passed by the receiver as the frequency deviation decreases, and a worsening signal-to-noise ratio results.

To overcome this problem, bandwidths smaller than the Carson's-rule bandwidth can be used when the noise level is high. A smaller bandwidth, however, causes distortion in the demodulated signal since more energy in the sidebands of the FM signal is being discarded, but this is preferable to passing more noise when the noise level is high. When the noise level is low, however, the demodulated signal quality is limited by the distortion components, and it is desirable to increase the bandwidth. Since, in practice, signal levels received by a mobile phone fade up and down due to motion and other effects, it is apparent that the bandwidth of a narrowband FM receiver preferably would adapt to those effects by varying continuously.

In addition, when signals on adjacent channels are strong, a narrower bandwidth that suppresses the adjacent-channel signals more may be better than a wider bandwidth that avoids distortion. When adjacent channel signals are weak or absent, however, a wider bandwidth that avoids distortion is preferable. Because both the levels of the desired signal and the adjacent-channel signals fade up and down in an uncorrelated fashion, their ratio can vary over a wide range, again indicating that an adaptive bandwidth can be advantageous.

U.S. Pat. No. 4,352,208 to Schroeder describes a microprocessor-controlled radio receiver system for automatically switching the bandwidth of an intermediate frequency (IF) stage between narrow and wide values. The narrow bandwidth is used in a normal mode of operation in which the receiver scans several channels. The wide bandwidth is used in a second mode in which a channel has been selected and there are no interfering signals on adjacent channels. Upon selection of a channel in the second mode, the microprocessor periodically causes a frequency synthesizer to scan up one channel and down one channel to determine if any interfering signal is present and then to return to the selected channel. If no interfering signal is present on an adjacent channel, the IF stage is switched from a narrow bandwidth to a wide bandwidth to improve the quality of reception. If an adjacent channel signal of sufficient IF energy is present, the IF stage remains in its narrow-bandwidth mode.

The system described in the Schroeder patent is unusable in a communication system, such as a mobile radio telephone system, in which interference situations are continuously changing. In such systems, it is undesirable, if not impossible, to permit even a temporary loss of the signal on the selected channel while the receiver checks the adjacent channels for interference. The present invention provides continuous comparison of in-channel and out-of-channel energy without continuously retuning the receiver.

U.S. Pat. No. 4,124,817 to Takahashi discloses a bandwidth switching circuit for an intermediate frequency amplifier stage in an FM receiver that insures clear reception of desired signals by automatically switching the intermediate frequency amplifier stage between the wide and narrow bandwidths according to the radio field conditions. The bandwidth switching circuit includes a detector for detecting beat components due to interference contained in received signals and a change-over switch for switching the bandwidth switching circuit according to signals detected by the detector, whereby the bandwidth of the intermediate frequency amplifier stage is automatically switched depending on whether the beat components are present or not.

SUMMARY OF THE INVENTION

It is an object of the present invention to provide improved capacity by reducing the bandwidth occupancy of analog frequency modulation systems. In particular, it is an object of the present invention to provide an implementation of a receiver that gives improved performance using 10 KHz channel-spaced narrowband frequency modulation.

The present invention concerns the provision of dynamically variable bandwidth in either AMPS mode or NAMPS mode in order to obtain the best compromise between distortion and noise or interference suppression. A preferred embodiment of the present invention allows the bandwidth to be dynamically varied between the 30 KHz value needed for AMPS and the 10 KHz value needed for NAMPS, thus realizing a dual-mode receiver.

In the present invention, a radio receiver is disclosed for demodulating both wideband and narrowband frequency-modulated signals. The radio receiver comprises a superheterodyne frequency means which converts the received frequency-modulated signal to a fixed intermediate frequency signal. A filter then filters the intermediate frequency signal with a first filter bandwidth adapted to a wideband frequency-modulated signal. The filtered wideband frequency-modulated signal is then demodulated in a demodulator using a frequency discriminator. The intermediate frequency signal is then filtered using a second and third filter bandwidth adapted to a narrowband frequency-modulated signal. Finally, the further-filtered intermediate frequency signal is demodulated using a frequency discriminator.

BRIEF DESCRIPTION OF THE DRAWINGS

These and other features and advantages of the invention will be readily apparent to one of ordinary skill in the art from the following written description, used in conjunction with the drawings, in which:

FIG. 3 schematically illustrates digital signal processing useful in the preferred embodiment of a dynamically variable bandwidth receiver shown in FIG. 2.

DETAILED DESCRIPTION

Figure 1:
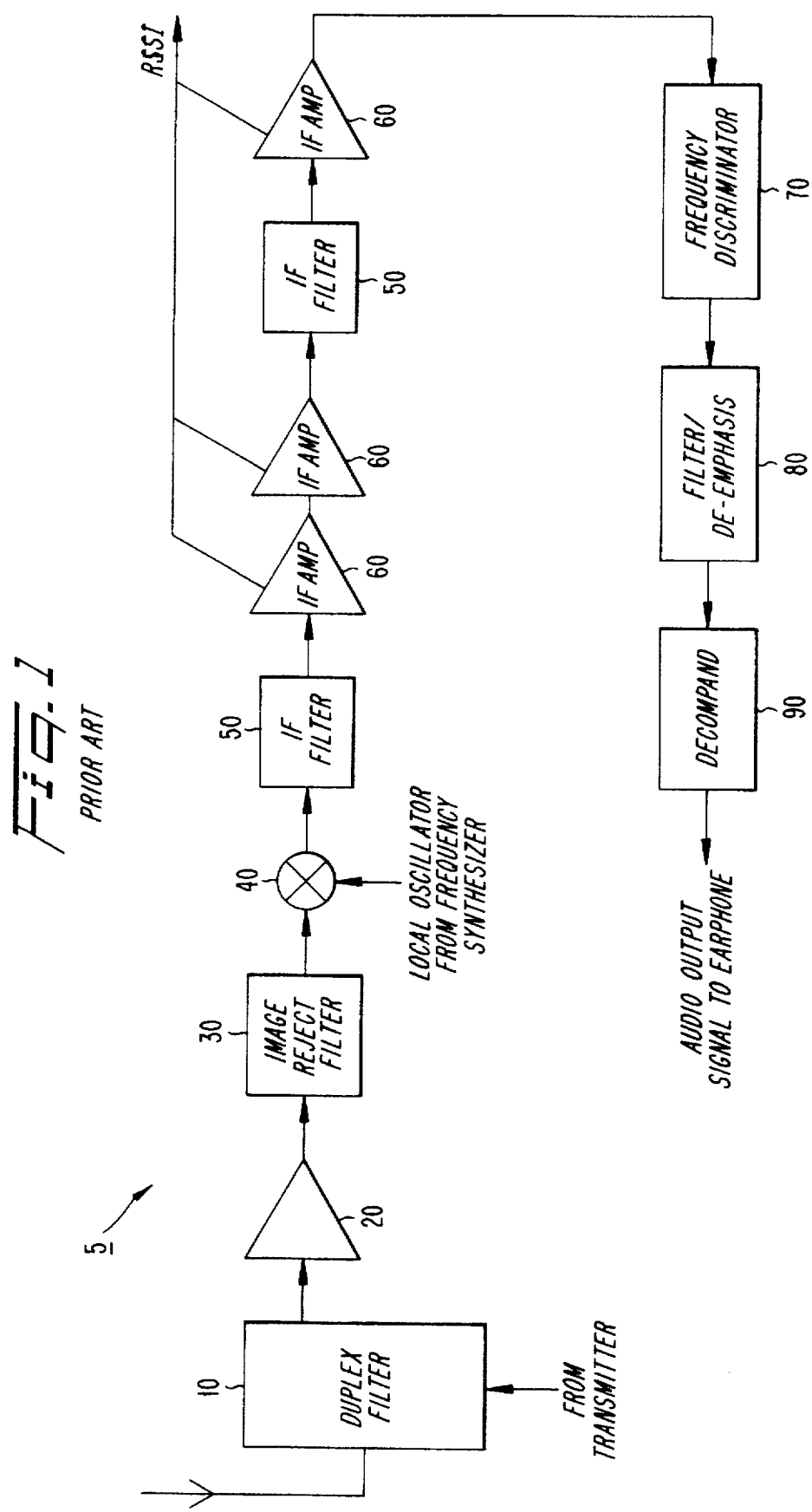
FIG. 1 schematically illustrates a conventional frequency modulation (FM) receiver.

FIG. 1 illustrates a block diagram of a conventional FM receiver 5 suitable for conforming to either the AMPS or NAMPS cellular mobile radiotelephone specifications, with the appropriate choice of intermediate frequency (IF) bandwidth of IF filters 50.

The received signal passes from the antenna through a transmit/receive duplex filter 10, a low-noise amplifier 20, an image rejection filter 30 and downconverter 40, such as a superheterodyne frequency device, where the received signal is converted to a suitable intermediate frequency (IF). The IF filters 50 impose the main channel bandwidth restriction to just less than 30 KHz for the AMPS specification, or around 10 KHz for the NAMPS specification. The IF amplifiers 60 provide most of the amplification and also generate a received signal strength indication (RSSI). It is common practice for all of the IF amplifiers 60 to be contained in a single integrated circuit, and for a second frequency downconversion to be employed part way through the amplification process ahead of the second IF filter 50, to permit the use of small, low-cost, ceramic filters. In addition, it is also easier to avoid unwanted oscillations due to stray feedback if the total amplification is split between two frequencies.

The frequency discriminator 70 operates at the final intermediate frequency ($IF_{final}$) and produces a signal output proportional to the instantaneous frequency deviation of the radio signal from its nominal center frequency, which is a facsimile of the speech signal used to frequency modulate the transmitter. The discriminator output signal is band-limited to the 300 Hz to 3.4 KHz speech frequency range in a de-emphasis filter 80 to exclude as much noise as possible. It is also well-known that the noise output of a frequency discriminator increases across the audio frequency band, so that the use of pre-emphasis at the transmitter with compensating de-emphasis in the de-emphasis filter 80 at the receiver 5 improves the signal-to-noise ratio by applying most of the attenuation to the highest noise components. It is also well-known that the perceived quality of speech has more to do with the background noise during silent or quiet periods than the signal-to-noise ratio during loud periods, so that the use of decompanding or expansion in a decompander 90 at the receiver 5, which magnifies the disparity between loud and quiet signals, with compensating companding at the transmitter, leaves the voice signal unchanged while reducing receiver noise in the quiet periods. The output of decompander 90 is then fed to the telephone earpiece.

In the conventional, known FM receiver illustrated in FIG. 1, the bandwidths of the IF filter 50 are fixed, since available analog filter technology does not easily permit the construction of filters of dynamically adjustable bandwidth. To construct a receiver suitable for operation either in the AMPS or NAMPS systems, a so-called dual-mode receiver would need to contain selectable 30 KHz wide AMPS filters and 10 KHz wide NAMPS filters. Both of these filters however would, in the conventional solution, have constant bandwidths.

Figure 2:
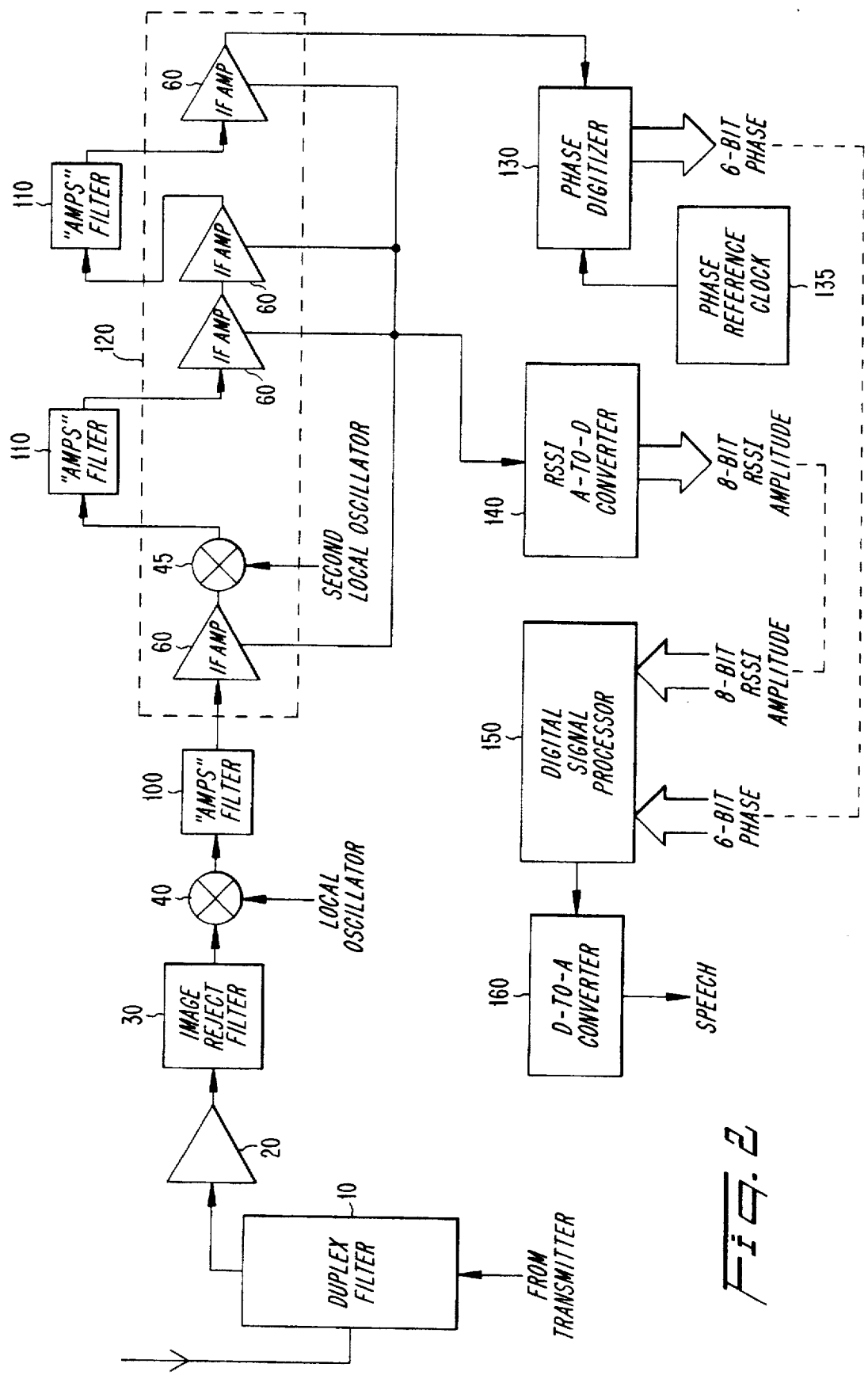
FIG. 2 schematically illustrates a preferred embodiment of a dynamically variable bandwidth receiver according to the present invention.

A preferred implementation of the dynamically variable bandwidth receiver of the present invention is illustrated in FIGS. 2 and 3. The dynamically variable bandwidth receiver begins with a conventional downconversion to a suitable first intermediate frequency (IF) as in FIG. 1, using a transmit/receive duplex filter 10, a low-noise amplifier 20, an image rejection filter 30, and a downconverter 40. Filters 100 and 110 impose a channel bandwidth in the 30 KHz region for the AMPS system. The intermediate frequency amplifier circuit 120 is a silicon integrated circuit which also contains a second downconversion at a downconverter 45.

Instead of a frequency discriminator, the hardlimited output from the final IF amplifier 60 is fed to a phase digitizing circuit that produces samples of the instantaneous phase of the signal. The received signal strength indicator (RSSI) signal generated by the IF amplifier circuit 120 is fed to an A-to-D converter 140 which produces a digitized value of signal strength. The RSSI signal is preferably linearly proportional to the logarithm of the signal amplitude. When digitized to 8-bit accuracy, the 8-bit value represents signals over, for example, a 128 dB range in steps of 0.5 dB, or over a 64 dB range in steps of 0.25 dB. The phase digitizer 130 compares signal transitions or edges on the hardlimited IF signal with those of a stable reference clock 135 to quantize the signal transitions to 6-bit phase accuracy. The 6-bit modulo-64 value maps exactly to the phase angle range 0 to $2\pi$ when both are viewed in the circular domain. Approximating the circle with a regular 64-gon, the mapping is given by:

$$\phi \rightarrow \phi_n = \frac{n\pi}{32} \mod 2\pi \forall \phi_n \leq \phi \leq \phi_{n+1}; n = 0,1,2,\ldots$$

where $\phi_{64} \equiv \phi_0$ because of circular periodicity.

The digitized log-amplitude and digitized phase together form a complex digital number in logpolar form, which is disclosed in U.S. Pat. No. 5,084,669 which is commonly assigned, the specification of which is hereby incorporated by reference. The stream of complex numbers at a suitably high sample rate, for example 240,000 samples per second (240 kilosamples per second or 240 kS/s), are fed to a digital signal processor (DSP) 150 where logpolar-to-cartesian conversion takes place resulting in complex numbers of the form, X+jY, where $j=\sqrt{-1}$. Automatic scaling takes place during this conversion so that the cartesian components fit within the fixed-point wordlength of the DSP 150.

Inside the DSP 150, the X+jY sample rate is first reduced by downsampling, that is, adding up blocks of adjacent samples over a moving window, to 80 kS/s to reduce the amount of subsequent arithmetic.

When the receiver is required to operate in the AMPS mode, the 80 kS/s stream is then submitted to a numerical frequency discrimination algorithm. The preferred algorithm is a digital phase lock loop, the details of which are beyond the scope of this disclosure but can be devised by anyone with ordinary skill in the art of numerical radio signal processing. In the alternative, the following algorithm can be employed:

1) Perform discrimination:

$$F_n = X_n Y_{n-1} - Y_n X_{n-1}; n=1,2,\ldots,N-1$$

2) Perform square amplitude calculation:

$$R_{sq} = X_n X_n + Y_n Y_n; n=0,1,2,\ldots,N-1$$

3) Rescale post-hardlimiting:

$$X_n^R = \frac{X_n}{R_{sq}} ; Y_n^R = \frac{Y_n}{R_{sq}} ; n = 0,1,2,\ldots,N-1$$

where $X_n^R$ and $Y_n^R$ are rescaled values, and N is the number of samples.

Another alternative is to submit the 240,000 samples per second (240 kS/s) of phase directly to a digital phase lock loop which calculates an instantaneous frequency at the desired 80 KHz downsampled rate. These calculations at an elevated rate may be performed with the aid of special digital logic in order to relieve the programmable DSP 150 of some of the load.

Once 80 kS/s of instantaneous frequency samples have been calculated, they are submitted to digital post-discriminator filtering, de-emphasis, downsampling and decompanding according to known digital filter and digital signal processing techniques to yield 8000 samples per second (8 kS/s) of digitized speech which is converted to an analog signal in D-to-A converter 160. The DSP 150 may also contain numerical calculation programs for other purposes, such as the decoding of the Manchester coded signalling data used in the AMPS system for control purposes.

When the receiver is desired to operate in the NAMPS mode, the X+iY stream is, after a first downsampling to 80 kS/s, submitted to a 64-tap finite impulse response (FIR) filter, such as the FIR filter 190 shown in FIG. 3, according to known theory, which reduces the bandwidth to that needed by NAMPS system, namely, a bandwidth that is in the 8 KHz to 12 KHz range. Furthermore, the output of the FIR filter 190 is further downsampled to 16 kS/s in order to reduce the amount of processing needed. A numerical frequency discriminator algorithm as outlined above is then applied to frequency demodulate the FIR filter 190 output and the usual audio filtering, de-emphasis and decompanding are also applied numerically, as shown by audio filter/de-emphasizer 210, decompander 220, and audio filter/downsampler 230 in FIG. 3.

The 64-tap filter coefficients may be calculated by means of a 64-point Fourier transform of an ideal rectangular filter frequency response having the desired bandwidth, and then multiplying the result with a raised cosine windowing function to reduce unwanted sidelobes. According to the present invention, at least two sets of these coefficients are precalculated which corresponds to at least two alternate NAMPS bandwidths, for example 8.75 KHz and 11.25 KHz. These correspond respectively to 64-point rectangular frequency responses respectively 7 or 9 points wide, that is,

00000000000000000000000000000011111110000000000000000000000000000 or

00000000000000000000000000000111111111000000000000000000000000000 since $$\left(\frac{7}{64}\right) 80\text{kHz} = 8.75\text{kHz}$$

and $$\left(\frac{9}{64}\right) 80\text{kHz} = 11.25\text{kHz}.$$

Only one set of coefficients is used at a time. Normally, the coefficients corresponding to 11.25 KHz bandwidth are used if adjacent channel interference levels are low. The amount of adjacent channel interference is determined by comparing the total signal power in the 80 kS/s stream before the FIR filter 190 with the total signal power in the 16 kS/s stream after the FIR filter 190. The former represents the power in a 30 KHz bandwidth embracing both adjacent channels while the latter represents the power in the desired or wanted channel. By subtracting the latter from the former, the power in the two adjacent channels is obtained. If this exceeds the power in the desired or wanted channel by more than a first threshold, an alternate, narrow bandwidth FIR filter is used.

When more than one alternate bandwidth is available, an even narrower alternate bandwidth may be selected when the adjacent channel-to-inband (in-channel) power ratio exceeds a second threshold. If the adjacent channel-to-inband (in-channel) power ratio falls below a third threshold, the bandwidth is widened again. A deliberate difference between the thresholds for narrowing and widening the bandwidths is employed in conjunction with the time constant τ for measuring the average signal powers in order to provide hysteresis and prevent excessive frequent bandwidth switching, which could otherwise cause audio noise.

Typically, the second threshold power ratio for switching from a first bandwidth of 11.25 KHz to a narrower bandwidth of 8.75 KHz would be 128 and the third threshold for switching back to 11.25 KHz would be 32. The time constant τ for determination of the desired or wanted channel power and the adjacent channel power is approximately 10 milliseconds (10 ms). Thus, the desired or wanted channel power is determined as the sum of squares of 16 KHz samples over a 160-sample moving window, since (16 kS/s)(10 ms)=160 samples, and the adjacent channel power is determined as the sum of squares of 80 KHz samples over an 800-sample moving window, since (80 kS/s)(10 ms)=800 samples.

The above-described digital signal processing is further illustrated in FIG. 3. The logpolar phase and RSSI values enter at 240,000 samples per second (240 kS/s) into a logpolar-to-cartesian conversion routine 170 that uses a COSINE/SINE table to calculate $\cos\phi$ and $\sin\phi$ and an ANTILOGARITHM table to convert the received signal strength indicator (RSSI) signal to an amplitude, having first subtracted a scaling value from the RSSI signal. The scaled amplitude A so obtained multiplies the $\cos\phi + j\sin\phi$ values to obtain X+jY values, where X=$A\cos\phi$, and Y=$A\sin\phi$.

The scaling value is determined such that the moving average of $X^2+Y^2$ over 800 samples is in a desired range without risk of overflow or underflow. To ensure this, the moving average is supplied to the scaling routine which increases the scaling value if the moving average is too high, and lowers the scaling value if the moving average is too low.

The scaled X+jY values at 240,000 samples per second (240 kS/s) are then downsampled to 80,000 samples per second (80 kS/s) in downsampler 180 by calculating the moving average over three consecutive samples and then adding up three consecutive values of the moving average to obtain each 80 kS/s sample. The 80 kS/s X+jY values are then squared and summed over an 800-sample moving window. This involves adding the newest sum-of-squares and subtracting the sum-of-squares calculated 800 samples ago, requiring a delay memory 800 samples long. To reduce the use of memory in the digital signal processor (DSP) 150, the moving average can be calculated with exponential rather than rectangular weighting of the past history of past samples. In exponential weighting, the new average Ai is calculated from the old average A(i–1) and the new sample Si as shown below $$Ai = A(i-1) + d(Si - A(i-1))$$

where d is a small value, e.g., 1/800

$$Ai = (1-d)A(i-1) + dSi$$

$$Ai = (799/800)A(i-1) + Si/800$$

Thus, all of the old samples contained in the old average get progressively reduced by the value (1–d)=799/800 which is slightly less than 1 at each iteration, so that a value of Si that was used N steps ago (Si-N) has been deweighted by $(1-d)^N$. The average is thus $Ai = Si + (1-d)S(i-1) + (1-d)^2 S(i-2) \ldots$ ect with increasing powers of (1–d). The advantage of this system is that no old sample values like S(i–799) are needed, but rather only the previous average and the new sample. In that case, the 160-sample moving average should also use exponential weighting of the past history of past samples.

The 64-tap FIR filters 190 also operate on the X+jY values using coefficients $C_1, C_2, \ldots, C_{64}$ which are selected from one of two alternative coefficient stores corresponding to a 8.75 KHz or 11.25 KHz bandwidth, respectively. The FIR-filtered X+jY values are output from the FIR filters 190 at a rate downsampled to 16 kS/s and are then processed in a digital phase lock loop frequency discriminator 200 to demodulate the frequency modulation. The frequency discriminator 200 output is then audio filtered and de-emphasized according to the NAMPS specification in an audio filter/de-emphasizer 210, decompanded in a decompander 220, and finally further audio filtered and down-sampled to 8 kS/s in an audio filter/downsampler 230 before being output to a D-to-A converter 160, as shown in FIG. 2.

The bandwidth determiner 240 uses an algorithm for determining whether the wide or narrow bandwidth should be used. The moving average and/or the moving sum of the FIR-filtered signal power is scaled by a factor of 5 in a scaler 250 to compensate for the difference between the different numbers of squares summed, or, alternatively, by another number appropriate to compensate as well for a non-unity scaling through the FIR-filters 190. The scaling of the FIR-filter coefficients $C_1, C_2, \ldots, C_{64}$ can in fact be deliberately chosen so that the required scaling for the 160-sample moving average is a power of two. The scaled, 160-sample moving average is then subtracted from the 800-sample moving average in a subtracter 260 to obtain the adjacent channel power. Then the adjacent channel power is compared in a comparator 270 with either 128 or 32 times the inband (in-channel) signal power, supplied by a scaler 255 (corresponding to either the second or third threshold power ratio, respectively), in order to determine whether the bandwidth should be decreased or increased, respectively.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A radio receiver for demodulating both wideband and narrowband modulated signals comprising:

superheterodyne frequency means for converting a received modulated signal to a fixed intermediate frequency signal;

means for wideband filtering said intermediate frequency signal with a first filter bandwidth to produce a first filtered signal, wherein said first filter bandwidth spans at least one wideband information channel and a plurality of narrowband information channels;

means for demodulating said first filtered signal to extract information;

means for digitizing said first filtered signal while preserving a complex vector value of said fixed intermediate frequency signal to produce a stream of complex-valued samples;

means for narrowband filtering said stream of complex-valued samples using a digital filter to produce a second filtered signal, wherein said digital filter has an adjustable filter bandwidth which is set to a second filter bandwidth or a third filter bandwidth in dependence upon a level of signal interference; and means for demodulating said second filtered signal to extract information.

2. The radio receiver according to claim 1, wherein said second filter bandwidth provides high signal quality when adjacent channel interference is lower than a predetermined first threshold and said third filter bandwidth provides high signal quality when adjacent channel interference is higher than a predetermined second threshold.

3. The radio receiver according to claim 1, wherein said digital filter is a finite impulse response filter.

4. A radio receiver for demodulating both wideband and narrowband frequency-modulated signals comprising:

superheterodyne frequency means for converting a received frequency-modulated signal to a fixed intermediate frequency signal;

means for wideband filtering said intermediate frequency signal with a first filter bandwidth to produce a first filtered signal, wherein said first filter bandwidth spans at least one wideband information channel and a plurality of narrowband information channels;

means for demodulating said first filtered signal to extract information;

means for digitizing said first filter signal while preserving a complex vector value of said fixed intermediate frequency signal to produce a stream of complex-valued samples;

means for narrowband filtering said stream of complex-valued samples using a digital filter having a variable filter bandwidth to produce a second filtered signal; and means for demodulating said second filtered signal to extract information.

5. The radio receiver according to claim 3, wherein said variable filter bandwidth is varied as a function of adjacent channel interference levels.

6. The radio receiver according to claim 5, wherein said adjacent channel interference levels are estimated from measurements of the level of intermediate frequency signals made before and after narrowband filtering.

7. The radio receiver according to claim 4, wherein said digital filter is a finite impulse response filter.

8. The radio receiver according to claim 4, wherein a frequency range within which said variable filter bandwidth is varied is deliberately restricted.

9. A radio receiver for demodulating both wideband and narrowband frequency-modulated signals comprising:

superheterodyne frequency means for converting a received frequency-modulated signal to a fixed intermediate frequency signal;

means for wideband filtering said intermediate frequency signal with a first filter bandwidth to produce a first filtered signal;

means for amplifying said first filtered signal and means for analog-to-digital converting said amplified first filtered signal while preserving a complex vector value of said intermediate frequency signal to produce a stream of complex-valued samples;

first means for processing said stream of complex vector samples in a numerical signal processor in order to demodulate said first filtered signal using a numerical frequency discriminator algorithm;

second means for processing said stream of complex vector samples in a numerical signal processor in order to narrowband filter said stream of complex-valued samples using a digital filter of variable bandwidth to produce a narrowband filtered intermediate frequency signal; and third means for processing said digitally filtered complex sample stream to demodulate said narrowband filtered intermediate frequency signal using a numerical frequency discriminator algorithm.

10. The radio receiver according to claim 9, wherein said variable filter bandwidth is varied as a function of adjacent channel interference levels.

11. The radio receiver according to claim 10, wherein said adjacent channel interference levels are estimated from measurements of the level of an intermediate frequency signal made before and after narrowband filtering.

12. The radio receiver according to claim 10, wherein said variable filter bandwidth is varied between first and second discrete values.

13. The radio receiver according to claim 11, wherein the first discrete bandwidth value is used to provide high demodulated signal quality when levels of adjacent channel interference are lower than a predetermined first threshold and the second discrete bandwidth value is used to provide high demodulated signal quality when levels of adjacent channel interference are higher than a predetermined second threshold.

14. The radio receiver according to claim 13, wherein said adjacent channel interference levels are estimated from measurements of the level of an intermediate frequency signal made before and after narrowband filtering.

15. The radio receiver according to claim 9, wherein the second processing means further comprises a finite impulse response filter.

16. The radio receiver according to claim 9, wherein a frequency range within which said variable filter bandwidth is varied is deliberately restricted.

17. The radio receiver according to claim 8, wherein said means for analog-to-digital converting digitizes said intermediate frequency signal directly before said first processing means resolves real and imaginary vector components of said intermediate frequency signal.

18. The radio receiver according to claim 9, wherein said intermediate frequency signal is resolved into real and imaginary components before separate analog-to-digital conversion of said real and imaginary components.

19. The radio receiver according to claim 9, wherein said means for analog-to-digital converting separately digitizes the phase and amplitude of said intermediate frequency signal and wherein conversion from polar form to real and imaginary vector components is performed by said first processing means.

20. The radio receiver according to claim 9, wherein said means for analog-to-digital converting separately digitizes the phase of said intermediate frequency signal and a signal proportional to the logarithm of the amplitude of said intermediate frequency signal and wherein conversion from logpolar form to real and imaginary vector components is performed by said first processing means.

21. A radio receiver for receiving and demodulating frequency-modulated signals comprising:

superheterodyne frequency means for downconverting a received signal to a convenient intermediate frequency signal;

means for filtering said intermediate frequency signal using a first filter bandwidth encompassing a first narrowband channel spectrum and at least part of an adjacent narrowband channel spectrum to produce a first filtered signal, wherein a combination of said first narrowband channel spectrum and said at least part of an adjacent narrowband channel spectrum corresponds to a wideband channel spectrum;

first means for measuring a first signal level of said first filtered signal;

means for digitizing said first filtered signal while preserving a complex vector value of said intermediate frequency signal to produce a stream of complex-valued samples;

means for filtering said stream of complex-valued samples using a digital filter having a variable bandwidth which only encompasses said first signal spectrum to produce a second filtered signal;

second means for measuring a second signal level of said second filtered signal;

means for processing said measured first and second signal levels to estimate a level of an adjacent channel signal compared to a desired signal level; and means for determining a bandwidth setting for said variable bandwidth digital filter using said estimated comparative level.

22. The radio receiver according to claim 21, wherein said digital filter is a finite impulse response filter.

23. The radio receiver according to claim 21, wherein a frequency range within which said variable filter bandwidth is varied is deliberately restricted.

24. A radio receiver for receiving and demodulating frequency-modulated signals comprising:

superheterodyne frequency means for downconverting a received signal to a convenient intermediate frequency signal;

means for filtering said intermediate frequency signal using a first filter bandwidth encompassing a first signal spectrum and at least some of an adjacent channel spectrum to produce a first filtered signal;

means for digitizing said first filtered signal using analog-to-digital converters preserving complex vector components of said first filtered signal to produce a stream of complex-valued samples; and means for processing said stream of complex-valued samples in a numerical signal processor, said process means comprising means for determining a first signal level of said first filtered signal, means for further filtering said filtered signal using a filter having variable bandwidth encompassing only said first signal spectrum to produce a second filtered signal, means for determining a second signal level of said second filtered signal, means for employing said determined first and second signal levels to estimate a level of adjacent channel interference relative to a desired signal level, and means for employing said estimated relative level to determine the bandwidth setting for said variable bandwidth filter.

25. The radio receiver according to claim 24, wherein said means for further filtering further comprises a finite impulse response filter.

26. The radio receiver according to claim 25, wherein said variable filter bandwidth is varied by varying tap coefficients of said finite impulse response filter.

27. The radio receiver according to claim 26, wherein said tap coefficients are varied between at least two sets of discrete values.

28. The radio receiver according to claim 24, wherein a frequency range within which said variable filter bandwidth is varied is deliberately restricted.

29. The radio receiver according to claim 28, wherein said frequency restriction further comprises hysteresis means for using hysteresis between a first threshold level of adjacent channel interference causing said variable filter bandwidth to be decreased and a second threshold level of adjacent channel interference causing said variable filter bandwidth to be increased.

30. The radio receiver according to claim 28, wherein said frequency restriction further comprises averaging means for averaging a filtered signal level measurement and a further-filtered signal level measurement.

31. The radio receiver according to claim 30, wherein said averaging means utilizes a moving average over a rectangular window.

32. The radio receiver according to claim 31, wherein said averaging means utilizes exponential weighting of past history.

33. The radio receiver according to claim 24, wherein the digitizing means digitizes said intermediate frequency signal directly before said processing means resolves real and imaginary vector components of said intermediate frequency signal.

34. The radio receiver according to claim 24, wherein said intermediate frequency signal is resolved into real and imaginary components before separate analog-to-digital conversion of said resolved real and imaginary components.

35. The radio receiver according to claim 24, wherein the digitizing means separately digitizes the phase and amplitude of said intermediate frequency signal and wherein conversion from polar form to real and imaginary vector components is performed by said numerical signal processor.

36. The radio receiver according to claim 24, wherein the digitizing means separately digitizes the phase of said intermediate frequency signal and a signal proportional to the logarithm of the amplitude of said intermediate frequency signal and wherein conversion from logpolar form to real and imaginary vector components is performed by said numerical signal processor.

37. A method for selectively demodulating wideband and narrowband modulated signals, comprising the steps of:

downconverting a received signal to an intermediate frequency signal;

wideband filtering the intermediate frequency signal using an analog filter having an analog filter bandwidth which spans at least one wideband information channel and a plurality of narrowband information channels to produce a wideband analog signal;

digitizing the wideband analog signal while preserving a complex vector value of said intermediate frequency signal to produce a stream of complex-valued samples;

filtering the stream of complex-valued samples using a digital filter to produce a digitally filtered signal;

adjusting a digital filter bandwidth of the digital filter in dependence upon a level of signal interference in the stream of complex-valued samples; and selectively demodulating either the wideband analog signal or the digitally filtered signal to extract an information signal.

38. The method of claim 37, wherein said step of adjusting a digital filter bandwidth of the digital filter comprises the steps of:

measuring adjacent channel interference in the stream of complex-valued samples;

setting the digital filter bandwidth to a first predetermined bandwidth to provide high signal quality in the digitally filtered signal when the measured adjacent channel interference is lower than a first preset threshold; and setting the digital filter bandwidth to a second predetermined bandwidth to provide high signal quality in the digitally filtered signal when the measured adjacent channel interference is higher than a second preset threshold.

* * * * *